United States Patent
Koyama et al.

(10) Patent No.: US 6,731,005 B2
(45) Date of Patent: May 4, 2004

(54) SEMICONDUCTOR DEVICE INCLUDING FUSES FOR RELIEVING DEFECTIVE AREAS

(75) Inventors: Hajime Koyama, Yokohama (JP); Koichi Fukuda, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/093,786

(22) Filed: Mar. 6, 2002

(65) Prior Publication Data

US 2002/0125576 A1 Sep. 12, 2002

(30) Foreign Application Priority Data

Mar. 6, 2001 (JP) ........................................ 2001-061443

(51) Int. Cl.⁷ ............................................... H01L 23/48
(52) U.S. Cl. ..................... 257/758; 257/209; 257/529; 365/96; 365/225.7; 337/401
(58) Field of Search ................. 257/209, 529; 365/96, 225.7; 337/401

(56) References Cited

U.S. PATENT DOCUMENTS

| | | | | |
|---|---|---|---|---|
| 5,949,323 A | * | 9/1999 | Huggins et al. | ............. 337/401 |
| 5,969,404 A | | 10/1999 | Bohr et al. | |
| 6,259,147 B1 | * | 7/2001 | Iwamoto et al. | ............. 257/529 |

FOREIGN PATENT DOCUMENTS

JP     2000-340757     12/2000

* cited by examiner

*Primary Examiner*—David Nelms
*Assistant Examiner*—Mai-Huong Tran
(74) *Attorney, Agent, or Firm*—Hogan & Hartson, LLP

(57) ABSTRACT

A semiconductor device is disclosed, which comprises a semiconductor substrate with which a circuit element is provided, an insulating layer which is provided on the semiconductor substrate and has a concave portion, a first conductive line layer which is provided at the concave portion in the insulating layer and has a first thickness, and a second conductive line layer which is provided at the concave portion in the insulating layer so as to be formed apart in a horizontal direction from the first conductive line layer and has a second thickness which is smaller than the first thickness.

16 Claims, 4 Drawing Sheets

SEMICONDUCTOR DEVICE INCLUDING FUSES FOR RELIEVING DEFECTIVE AREAS

CROSS-REFERENCE TO RELATED APPLICATIONS

This application is based upon and claims the benefit of priority from the prior Japanese Patent Application No. 2001-061443, filed Mar. 6, 2001, the entire contents of which are incorporated herein by reference.

BACKGROUND OF THE INVENTION

1. Field of the Invention

The present invention relates to a highly integrated semiconductor device, and in particular, to a semiconductor device which includes fuses for relieving defective areas in the semiconductor device.

2. Description of the Related Art

In a semiconductor device whose high integration is proceeding, reduction in circuit design rule is adopted as requirement of scaling down of the device. In a semiconductor device whose large scale integration is proceeding such as a DRAM in particular, a tendency of reduction in the circuit design rule is significant. In accordance with scaling down of the device, a redundancy technique in which an defective area is relieved by substituting the defective area with a redundant circuit provided in advance is widely utilized.

In actuality, it is difficult to produce a product without defective memory cells. Namely, it is difficult to produce normal memory cells for all bits. In an ordinary semiconductor storage device, defective memory cells are identified by a die sorting test and then the defective memory cells are substituted by redundant portions.

As an increase in capacity of semiconductor device proceeds, the number of defective bits increases. Also, the number of fuses for relieving the defective bits increases. In order to maintain a certain manufacturing yield rate, a predetermined number or less of the defective bits must be relieved by the fuses. At least several hundreds defective bits must be relieved by the fuses.

For example, a large capacity DRAM, about 10,000 fuses are provided in a semiconductor device. If a storage capacity of the device is increased twice with the same design rule, a chip area is increased twice. Thus, physical effects on memory cells caused by small dusts or foreign matters become significant. As a result, the number of defective bits is increased. Further, scaling down of the device proceeds, more elements are covered by the same dusts so as to be defective. Consequently, the number of defective bits increases.

In a fuse circuit for substituting the defective memory cells with the redundant circuit, fuses corresponding to the defective portions must be blown out. To blown out the fuses, laser is irradiated onto specified fuses and then only the specified fuses are blown out.

FIGS. 6A and 6B show conventional fuses in a perspective manner. In FIG. 6A, eight fuses, i.e., first through eighth fuses 50, 51, 52, 53, 54, 55, 56 and 57 are shown. In contrast to a state shown in FIG. 6A, FIG. 6B shows a state in which laser is irradiated onto specified fuses. In FIG. 6B, the first fuse 50, the third through fifth fuses 52, 53, 54 and the seventh fuse 56 have a thickness at a time of being formed, i.e., an initial thickness. These fuses are used with their storage state "1" stored therein.

In FIG. 6B, portions without fuse materials at laser irradiated portions in the second fuse 51, the sixth fuse 55 and the eighth fuse 57, i.e., a second fuse removed portion 58, a sixth fuse removed portion 59 and an eighth fuse removed portion 60 refer to portions that fuses are removed by laser irradiation. These fuses are used with their storage state "0" stored therein. Here, "1" state is stored in the five fuses 50, 52, 53, 54 and 56. On the other hand, "0" state is stored in the three fuses 51, 55 and 57 having the fuse removed portions 58, 59 and 60, respectively. In total, the eighth power of 2, i.e., 256 bits are stored in the device.

It is considered that the area of fuses is reduced by reducing a size of the fuse. However, because of a limit to a precision of focal position of laser irradiation in a laser blow device used for blowing fuses is provided of a constraint in spot diameter of laser light, it is difficult to set the fuse so as to be narrower than a certain width. Thus, the area of fuses cannot be further reduced.

FIGS. 1 through 6 in Jpn. Pat. Appln. KOKAI Publication No. 2000-340757 disclose a nonvolatile semiconductor storage device which has a high resistance element between a bit line and a drain, in which a plurality of resistance values are set by changing a width or length of the element at a time of design. However, a semiconductor device which uses a fuse whose resistance value can be changed after the design and in a final stage of manufacturing process of the device is not disclosed.

There arise problems in conventional semiconductor devices.

In accordance with an increase in storage capacity and proceeding of scaling down of the device, an area of fuses for relieving increasing defective bits must be enlarged. As a result, a ratio of the fuse area with respect to a chip becomes large. Since a large number of fuses are provided in the semiconductor device, an area of fuses which occupies the device is presently about 0.4%. In the future, further increase in capacity and scaling down of the device proceed, and a ratio of the fuse area may increase.

Since the number of bits to be relieved increases in accordance with an increase in capacity, the above-described problem becomes more serious. In a near future, the fuse area may be a factor which prevents compactness of chip. Further, if compactness of chip is prevented, a yield of semiconductor device per semiconductor wafer is decreased such that a manufacturing cost per chip is increased. Accordingly, reduction in the area of fuses must be needed in order to realize an increase in capacity.

Further, binary, i.e., "0" or "1" is conventionally stored by determining whether or not fuses are blown out. For this reason, if an amount of information to be stored in the fuse is increased, the number of fuses is increased. In this case, when the number of fuses are increased, as described above, the ratio of fuse area which occupies the semiconductor device is increased.

BRIEF SUMMARY OF THE INVENTION

According to an aspect of the present invention, there is provided a semiconductor device comprising:

a semiconductor substrate with which a circuit element is provided an insulating layer which is provided on said semiconductor substrate and has a concave portion; a first conductive line layer which is provided at said concave portion in said insulating layer and has a first thickness; and a second conductive line layer which is provided at said concave portion in said insulating layer so as to be formed apart in a horizontal direction from said first conductive line layer and has a second thickness which is smaller than the first thickness.

According to another aspect of the present invention, there is provided a semiconductor device comprising a semiconductor substrate with which a circuit element is provided; an insulating layer which is provided on said semiconductor substrate and has a concave portion; and a conductive line layer made of N layers (wherein N is an integer of 2 or larger) which is provided at said concave portion in said insulating layer, with each layer having the same width, length and thickness, and its resistance value being successively smaller toward the bottom layer.

According to a further aspect of the present invention, there is provided a semiconductor device comprising a semiconductor substrate with which a circuit element is provided an insulating layer which is provided on said semiconductor substrate and has a concave portion; a first fuse which is provided at said concave portion in said insulating layer and is formed by laminating K fuse layers with different resistance values (wherein K is an integer of 2 or larger); and a second fuse which is provided at said concave portion in said insulating layer so as to be spaced apart from said first fuse, with its end portion having the same laminated structure as that of said first fuse, and its layers from the top layer of said first fuse to the Lth fuse layer (wherein L is an integer of 1 or larger and less than K) being removed at its portion other than said end portion

DETAILED DESCRIPTION OF THE INVENTION

Figure 1A:
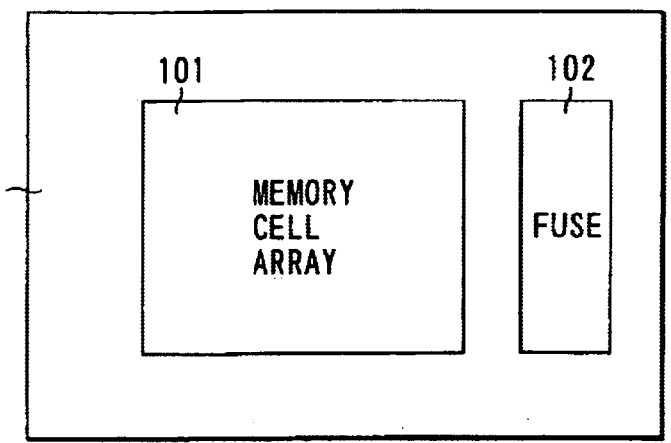
FIG. 1A is a schematic plan pattern view of a semiconductor device according to a first embodiment of the present invention, showing a circuit element region and a fuse arrangement region.

Next, embodiments of the present invention will be described with reference to the drawings. In the description of the drawings, the same or similar portions are denoted by the same or similar reference numerals. Here, as the drawings are typical, the relationship between thickness and planar dimension and a thickness ratio of respective layers are different from actual ones. Thus, specific thickness or dimension should be determined by taking the following description in consideration. Further, portions with different dimension or ratio between the drawings are included therein.

(First Embodiment)

A semiconductor device relating to a first embodiment of the present invention will be described with reference to FIGS. 1A, 1B, 2A, 2B and 3A through 3C.

FIG. 1A is a schematic plan pattern view of a semiconductor device according to a first embodiment of the present invention, showing a circuit element (e.g. memory cell) region 101 and a fuse arrangement region 102.

Figure 1B:
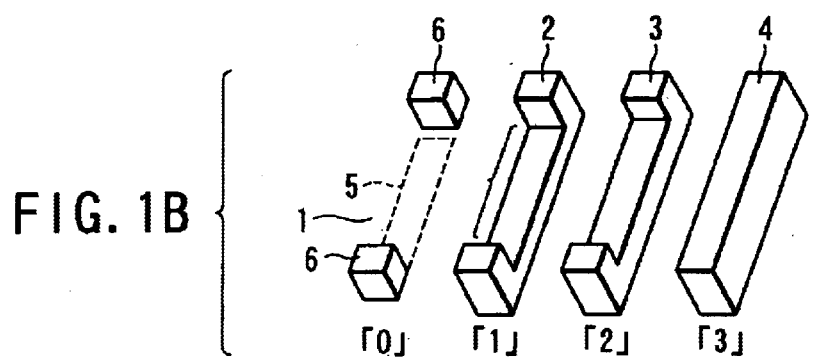
FIG. 1B is a perspective view of an arrangement of fuses in a semiconductor device according to the first embodiment of the present invention.

FIG. 1B is a perspective view of arrangement of four fuses 1, 2, 3 and 4. In the first embodiment, quaternary data can be set by setting a thickness of one fuse to one of three thicknesses. Conventionally binary data is set by determining whether or not one fuse is blown out. In this embodiment, the thickness of a fuse is set to one of thicknesses set in stepwise such that one fuse can correspond to two fuses.

A laser irradiated portion 5 of a first fuse 1 is removed by laser irradiation such that only an end portion 6 of the fuse 1 remains. In this state, for example, "0" information is stored in the fuse.

Fuse material remains at the laser irradiated portions 5 of a second fuse 2 which is adjacent to the first fuse 1 and a third fuse 3 which is adjacent to the second fuse 2. The thickness of the laser irradiated portion 5 in the fuse 2 is thinner than that of the fuse 3. In other words, the thickness of the laser irradiated portion 5 in the fuse 3 is thicker than that of the fuse 2. In the first embodiment, other than the fuse 1 with its laser irradiated portion 5 removed, the fuse 2 has a smallest thickness at the laser irradiated portion 5 among those of fuses 2 to 4. Accordingly, other than the fuse 1 with its laser irradiated portion 5 removed, the fuse 2 has a largest resistance value. The fuse 2 stores, for example, "1" information. The fuse 3 has a thicker thickness at its laser irradiated portion 5 than that of the fuse 2 so as to have a resistance value smaller than that of the fuse 2. The fuse 3 stores, for example, "2" information. Here, the thickness of fuse does not refers to a thickness of the end portion 6 but a thickness of the laser irradiated portion 5 subjected to laser irradiation.

The fourth fuse 4 which is adjacent to the third fuse 3 is set to have a thicker thickness than that of the fuse 3 so as to have a resistance value smaller than that of the fuse 3. Laser is not irradiated onto the fourth fuse 4 such that the thickness of the end portion 6 is maintained at the laser irradiated portion 5. Namely, the whole fuse 4 has the same thickness as that of the end portion 6. The fourth fuse 4 stores, for example, "3" information.

As described above, in the fuses 1, 2, 3 and 4, their laser irradiated portions 5 subjected to laser irradiation are respectively set to predetermined thicknesses. That is, at a time of irradiating laser onto each of the fuses, irradiation energy or irradiation time is varied stepwise for each fuse such that an amount of fuse material to be removed is varied stepwise.

The end portion 6 which is not subjected to laser irradiation maintains a thickness prior to laser irradiation. In each of the fuses, as its resistance value depends on a resistance value of the laser irradiated portion 5 which occupies almost entire of the fuse, i.e., on a resistance value on a portion with small thickness, the resistance value of the fuse can be determined by removing, with laser irradiation, the laser irradiated portion 5 by a predetermined amount.

Since the resistance value is in inverse proportion to the thickness of fuse, the thicker the fuse is, the smaller its resistance value is. Further, the thinner the fuse is, the larger its resistance value is. Various information are defined corresponding to various resistance values of the fuses.

Here, it is assumed that the thickness of the fuse prior to laser irradiation is, for example, 0.4 $\mu$m. Then, fuses are subjected to laser irradiation so as to have thicknesses of 0.2 $\mu$m, 0.1 $\mu$m and 0.05 $\mu$m such that multiple-valued information can be stored. By adjusting the thickness of fuses, the resistance values of the fuse can be varied such that multiple-valued information can be obtained with one fuse.

In order to prevent erroneous read of information, the resistance values of the fuses are desirably determined so as to have a large difference therebetween.

The fuses 1, 2, 3, 4 have the same length and width, and are made of the same materials.

The number of types of thickness of the fuses is not limited to four shown in FIG. 1B. There may be three or five or more types of thickness. Namely, the amount of information stored in the fuse is increased by the number of types of thickness.

Figure 2A:
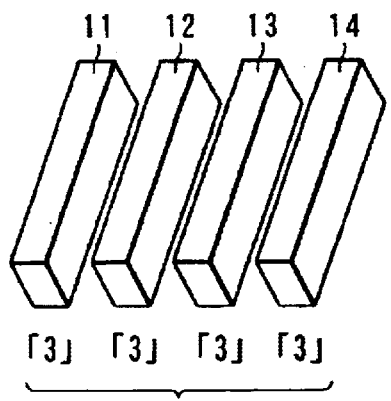
FIG. 2A is a perspective view showing a state of fuses prior to laser irradiation in the semiconductor device according to the first embodiment of the present invention.
Figure 2B:
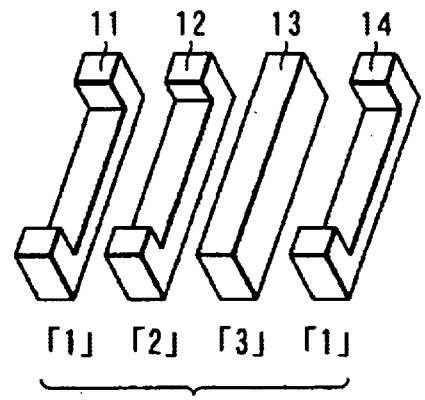
FIG. 2B is a perspective view showing a state of fuses subsequent to laser irradiation in the semiconductor device according to the first embodiment of the present invention.

FIG. 2A shows a perspective view of an arrangement of four fuses 11, 12, 13 and 14 prior to laser irradiation. Each fuse has the largest thickness prior to laser irradiation. This state corresponds to "3" information. In contrast to this state, FIG. 2B shows a state in which if laser with a predetermined energy is irradiated onto each of the fuses 11, 12 and 14. In this example, the fuse 13 is not subjected to laser irradiation.

In FIG. 2B, the first fuse 11 is formed so as to have the smallest thickness and has "1" information stored therein. The second fuse 12 which is adjacent to the first fuse 11 is formed so as to be thicker than the first fuse 11, and has "2" information stored therein. The third fuse 13 which is adjacent to the second fuse 12 is formed so as to be thicker than the second fuse 12, and has "3" information stored therein. The fourth fuse 14 which is adjacent to the third fuse 13 is formed so as to be as thick as the first fuse 11. Namely, the fuse 13 is not subjected to laser irradiation in this example. The fourth fuse 14 has "1" information stored therein.

In FIG. 2B, no fuse is blown out, however the fuses may be appropriately brown out.

Figure 6A:
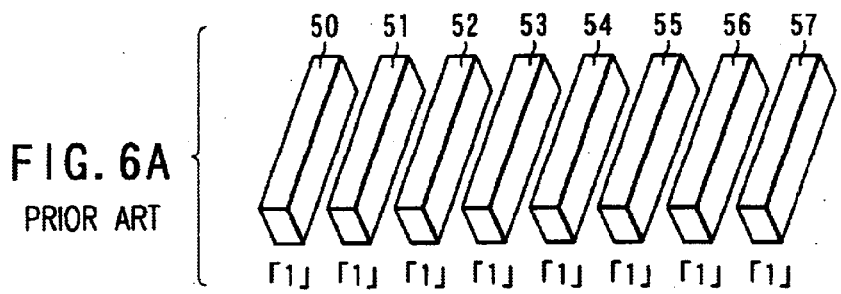
FIG. 6A is a perspective view showing a state of fuses prior to blowing out the fuses in a conventional semiconductor device.
Figure 6B:
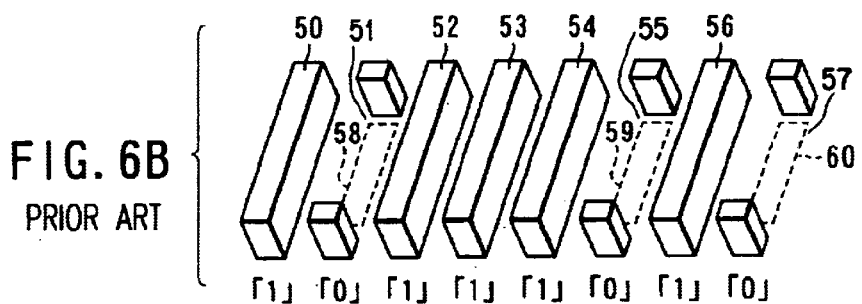
FIG. 6B is a perspective view showing a state of fuse subsequent to blowing out the fuses in the conventional semiconductor device.

The four fuses with the above-described structure have the fourth power of 4, i.e., 256 ways of the amount of information which corresponds to the amount of information of eight fuses shown in FIG. 6B. Consequently, a semiconductor device with necessary storage capacity can be realized with the number of fuses which is half the number of fuses used in prior art.

When the first embodiment is implemented by using the same number of fuses as that of the conventional semiconductor shown in FIG. 6A, i.e., by using eight fuses, each fuse may have one of four values from "0" to "3" such that its amount of information is the eighth power of four, i.e., 65,536 bits.

The number of fuses formed in the fuse area provided in a concave portion of an insulating film, four fuses in FIG. 4 is one example. In actuality, about a few thousands of fuses are formed in one fuse area.

A plurality of fuse areas may be formed within the semiconductor device. The fuse relating to the first embodiment may be utilized for all fuse areas. Alternatively, the fuse relating to the first embodiment may be utilized in fuse areas specified from the plurality of fuse areas, and a conventional binary fuse may be utilized in other fuse areas.

In this case, it is preferable that the area where the fuse relating to the first embodiment is provided relieves a memory cell with particularly large amount of information. The first embodiment is implemented in a case where there is relatively small fuse area caused by the arrangement of circuits in the semiconductor device. Thus, it is possible to prevent an arrangement constraint of the fuse area such that the fuse area with large storage capacity including required relieve function can be formed.

For example, a TiN layer with a thickness of about 0.01 $\mu$m is formed as a bottom layer. On the TiN layer, a Ti layer with a thickness of about 0.01 $\mu$m is provided. On the Ti layer, an AlCu layer with a thickness of about 0.33 $\mu$m is provided. On the AlCu layer, a Ti layer with a thickness of about 0.005 $\mu$m is provided. On the Ti layer, a TiN layer is formed so as to have a thickness of about 0.04 $\mu$m. As a result, a fuse with a thickness of about 0.395 $\mu$m is formed. Namely, the resultant fuse is formed mainly of AlCu and a barrier metal made of thin Ti or the like is formed on its surface.

Other materials may be appropriately used in place of the AlCu layer as long as these materials those materials have physico-chemical characteristics. Further, the fuse may be formed of a large number of materials by combining a large number of materials so as to have a laminated structure. In the fuse with the above-described structure, thicknesses of the AlCu layer and other structural layers may be appropriately changed.

Figure 3A:
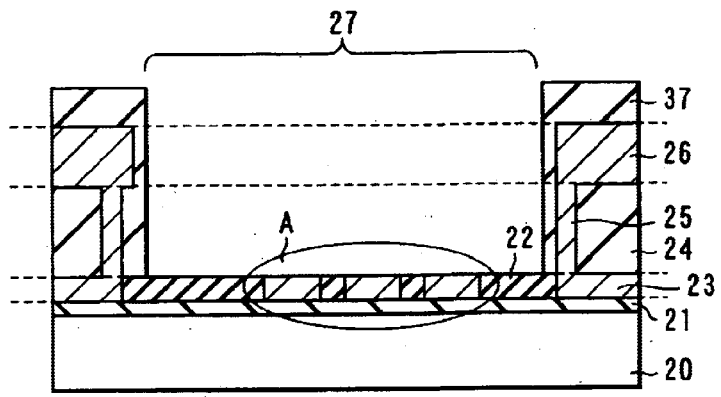
FIG. 3A is a cross-sectional view for explaining a structure of the semiconductor device according to the first embodiment of the present invention.

Here, a state in which fuses are formed on a semiconductor substrate will be described with reference to a cross-sectional view shown in FIG. 3A. FIG. 3A shows a cross-sectional view showing a state in which a plurality of fuses, prior to laser irradiation, with a predetermined thickness are formed in a concave portion in an insulating film provided on the semiconductor substrate so as to be spaced apart from each other in a horizontal direction.

As shown in FIG. 3A, a second insulating film 22 and a first wiring line layer 23 are formed on a first insulating film 21 formed on a semiconductor substrate 20. Circuit elements such as a source of MOS transistor, drain (not shown) and the like are formed at the semiconductor substrate 20. The first wiring line layer 23 is connected via a contact 25 provided in an interlayer insulating film 24 to a second wiring line layer 26 on the interlayer insulating film 24. An insulating layer 37 is formed on the second wiring line layer 26. The insulating layer 37 has, for example, a laminated structure made of passivation film and polyimide film. A concave portion 27 is formed in the interlayer insulating film 24 and the insulating film 37. A plurality of fuses are formed at the second insulating film 22 formed on a bottom portion of the concave portion 27.

Figure 3B:
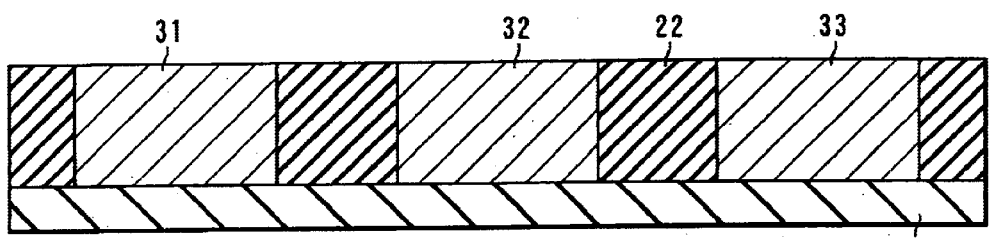
FIG. 3B is a cross-sectional view showing a state of enlarged fuse portion prior to laser irradiation in the semiconductor device according to the first embodiment of the present invention.

FIG. 3B shows the area A shown in FIG. 3A in an enlarged manner. Laser is not irradiated on each of the fuses 31, 32 and 33 shown in FIG. 3B such that these fuses maintain an initial thickness at the time of being formed. In this state, fuses store "3" information.

Figure 3C:
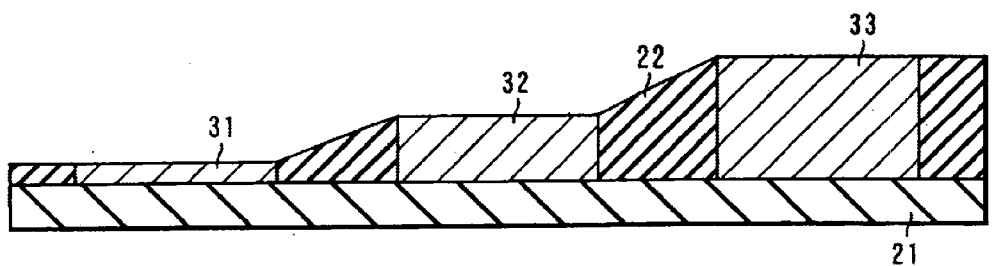
FIG. 3C is a cross-sectional view showing a state of enlarged fuse portion subsequent to laser irradiation in the semiconductor device according to the first embodiment of the present invention.

FIG. 3C shows a state in which laser is irradiated on each of the fuses 31, 32 and 33 in the area shown in FIG. 3B. In FIG. 3C, the first fuse 31 on the left side is formed so as to be the thinnest, and has "1" information stored therein. Laser irradiated portions of the insulating film around the embedded fuses are removed.

The second fuse 32 which is adjacent to the first fuse 31 is formed so as to be thicker than the first fuse 31, and has "2" information stored therein.

The third fuse 33 which is adjacent to the second fuse 32 is formed so as to be thicker than the second fuse 32, and has "3" information stored therein.

By selectively setting the thickness of the fuses and varying the resistance value of the fuses, multiple-valued information can be held.

The insulating film such as a polyimide film may be applied on the surface of the fuses subjected to laser irradiation, i.e., on the insulating film formed on the bottom surface of the concave portion 27 to protect the surface of the fuses.

The fuse is partially evaporated or blown out by heat with laser irradiation. If a thin interlayer insulating film is formed on the fuse, heat is built up in the interlayer insulating film subjected to laser irradiation such that the fuse can be partially evaporated or blown out with less heat. Alternatively, the fuse may be exposed without forming the interlayer insulating film thereon.

The interlayer insulating film is not limited to an $SiO_2$ film, and other oxide films may be used.

The fuses 31, 32 and 33 are formed on the insulating film 21 formed on the semiconductor substrate 20. The surfaces of the fuses 31, 32 and 33 are exposed. Thin interlayer insulating film may be formed on their surfaces.

The thick interlayer insulating film 24 or the second wiring line layer 26 which is formed in the other area is not formed in the area where the fuses 31, 32 and 33 are formed. Thus, laser can be irradiated without being transmitted through the thick interlayer insulating film 24 onto the fuses 31, 32 and 33.

The fuses 31, 32 and 33 may be formed at the same stage as the second wiring line layer 26 in FIG. 3A. The concave portion 27 in the area where the fuses are formed may not be formed.

Heat energy on the surface of the fuse caused by laser irradiation is easy to be dispersed from the fuse to the $SiO_2$ film with high heat conductivity by laminating the $SiO_2$ film compared to a case in which no film is laminated. Thus, it is possible to precisely adjust variation in fuse thickness. Namely, because of the $SiO_2$ film on the upper layer of the fuse, a rate of partial evaporating of the fuse can be lowered such that the resistance value can be easily adjusted.

If the fuses 31, 32 and 33 are formed on the same stage as the first wiring line layer used for ordinary wiring, the fuses may be made of the same materials as those of the first wiring line layer. Further, the fuses may have the same width and thickness as those of the first wiring line layer. For this reason, a process for forming fuse can be performed at the same time when a process for forming the first wiring line layer is performed. It is preferable in view of manufacturing method of semiconductor device.

The fuses 31, 32 and 33 may be formed as the same stage as the second wiring line layer 26 formed on the first wiring line layer 23 used for ordinary wiring within the semiconductor device. In this case, the fuses may be made of the same materials as those of the second wiring line layer 26. Further, the fuses may have the same width and thickness as those of the second wiring line layer 26. For this reason, a process for forming fuse can be performed at the same time when a process for forming the second wiring line layer is performed. It is preferable in view of manufacturing method of semiconductor device.

In the semiconductor device, an upper ordinary wiring layer is usually formed so as to be thicker and wider than a lower ordinary wiring layer. Thus, if the fuse is formed at the same stage as the second wiring line layer, the fuse has relatively large thickness and width. A resistance of fuse which is not subjected to laser irradiation at all can be set so as to be smaller than that of fuse formed on the first wiring line layer. Consequently, a range of the resistance value which can be set for the fuse can be set larger, and more types of fuses with various thicknesses can be set by laser irradiation.

The thickness of the fuse which is set so as to have multiple layers has a constraint which relates to controllability of laser at a time of laser irradiation and a constraint which relates to identification of the resistance value at a time of reading out the resistance of the fuse. In the constraint which relates to identification of the resistance value, the resistance value is identified not in an analog manner but in a digital manner. Thus, a certain margin needs to be provided for the resistance value at a time of reading out the set resistance value such that a different in resistance is provided between the resistance values. If the margin is not provided for the resistance value, the resistance may be incorrectly identified. Both of the constraints are relaxed by making the initial thickness of the fuse prior to laser irradiation thicker. That is, the fuse with more types of thicknesses can be formed by making the thickness of the fuse prior to laser irradiation thicker. As a result, the mount of information stored in the fuse can be increased.

The fuse can be made of unique materials with unique thickness and width for optimized fuse formation, independent of other wiring layers.

A read out circuit is connected to the fuses such that a latch circuit within the read out circuit holds data stored in the fuses.

Preferably, a plurality of fuse areas are usually provided in a evaporated manner within the semiconductor device such that a length of wirings from the fuses to the circuits is short.

In the first embodiment, each of the portions subjected to laser irradiation of the fuses 31, 32 and 33 has a uniform thickness within each of the fuses, but may have partially different thicknesses. Further, the surface of the fuse may be formed in a wavy shape or in stepwise. In this case, an easily identified difference in thickness needs to be provided between portions of fuses with the thinnest thickness which occupy most of fuse areas. This is because the resistance of the fuse depends on a resistance value of its portion with the thinnest thickness in the fuse area. By varying the thickness of most of the fuse area with laser irradiation, the resistance value of the fuse can be set to a predetermined value.

Other than blowing the fuse, the fuse can be partially evaporated so as to change the resistance of the fuse to any one of several values. Then, by determining the resistance value, multiple-valued information such as "0", "1", "2" (ternary), "0", "1", "2", "3" (quaternary) and "0", "1", "2", "3", . . . "n" (n+1 value) can be stored in the fuse.

By thus adjusting the thickness of the fuse and setting several resistance values, a semiconductor device in which multiple-valued information can be stored in one fuse can be provided.

In accordance with the first embodiment, a semiconductor device in which an area of fuse corresponding to the amount of information required for relieving defective bits can be made small and the ratio of the fuse area can be made small can be provided. Since the number of fuses can be lessened compared to the prior art while maintaining the number of bits to be relieved, the area of fuse can be effectively reduced.

Further, a semiconductor device which includes a fuse with small area but large storage capacity, which is formed by increasing the storage capacity of information per unit area. The amount of information to be stored can be increased with the same number of fuses as that of prior art. Namely, by adjusting the thickness of fuse on a chip of the semiconductor device so as to vary the resistance value of the fuse in a several steps, the multiple-valued information can be obtained with one fuse. The amount of storage of the fuse can be significantly increased in a case where the area of fuse is as large as that of the conventional binary fuse such that the amount of information per fuse can be increased.

(Second Embodiment)

Figure 4A:
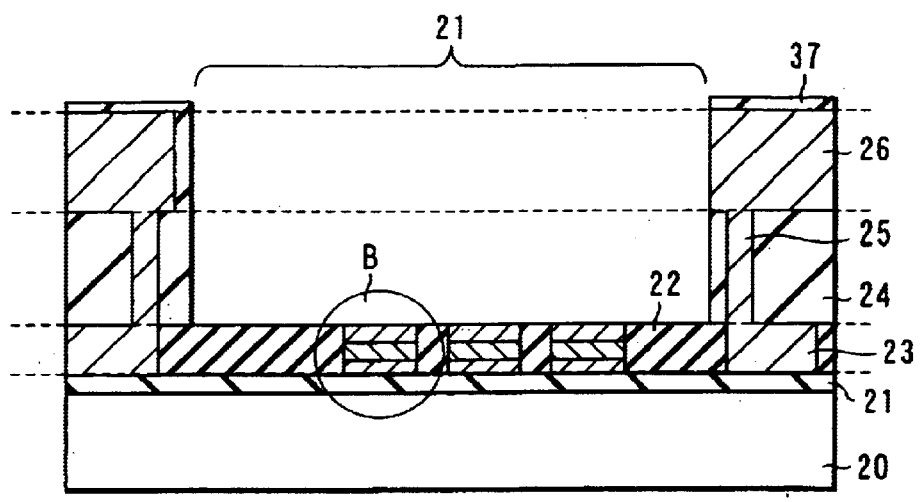
FIG. 4A is a cross-sectional view showing a structure of a semiconductor device according to a second embodiment of the present invention.
Figure 4B:
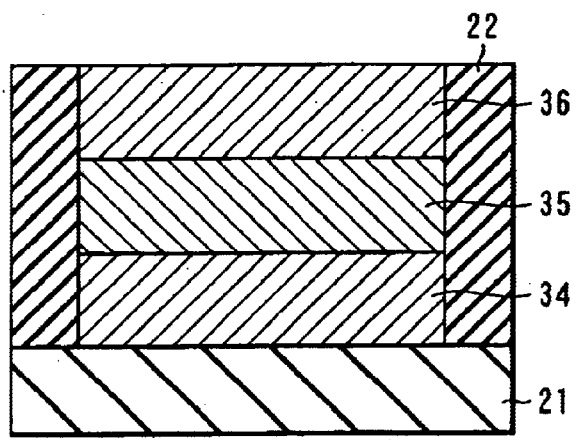
FIG. 4B is a cross-sectional view showing a state of enlarged fuse portion prior to laser irradiation in the semiconductor device according to the second embodiment of the present invention.

FIG. 4A shows a cross-sectional view of a semiconductor device relating to a second embodiment of the present invention. The semiconductor device is provided with fuses. Compared to the first embodiment shown in FIG. 3A, a structure of the fuse is different in the second embodiment. As shown in FIG. 4B in which the B portion shown in FIG. 4A is enlarged, fuses 33 are spaced apart from each other in a horizontal direction, and each of the fuse 33 is formed by laminating three layers of fuse materials with different resistances.

The semiconductor device has the fuse 33 which is formed by a first fuse layer 34 on a first insulating film 21 formed on a semiconductor substrate 20, a second fuse layer 35 formed on the first fuse layer 34 and a third fuse layer 36 formed on the second fuse layer 35. The third fuse layer 36 which is the top layer has a resistance lower than that of the underlying second fuse layer 35. The second fuse layer 35 is set to have a resistance lower than that of the underlying first fuse layer 34.

As described above, the fuse is formed by laminating three layers of fuse materials with different resistances. The fuse materials with different fuse materials are set for each fuse. Alternatively, composition of the materials is varied for each fuse. In this case, by changing laser intensity (energy density) and irradiation time, an amount of evaporating of fuses can be varied stepwise and thus the resistance value of the fuses can be varied. Namely, by laminating fuse materials with different resistance values, variation of the resistance value subsequent to partial evaporating of fuse caused by laser irradiation can be made large.

Here, assume that the first fuse layer 34 has a resistance R1, the second fuse layer 35 has a resistance R2 and the third fuse layer 36 has a resistance R3. In a state shown in FIG. 4B in which no fuses are blown out at all, the first fuse layer 34, the second fuse layer 35 and the third fuse layer 36 are connected in parallel to a fuse read out circuit (not shown). At this time, a resistance value R4 is represented by the following formula (1).

$$R4 = R1 \times R2 \times R3 / (R1 \times R2 + R1 \times R3 + R2 \times R3) \quad (1)$$

Figure 4C:
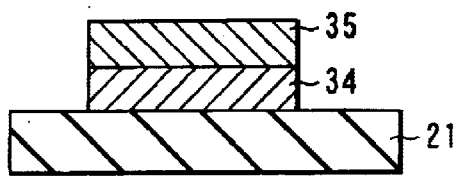
FIG. 4C is a cross-sectional view showing a state of enlarged fuse portion subsequent to laser irradiation in the semiconductor device according to the second embodiment of the present invention.

Next, in a state shown in FIG. 4C in which the third fuse layer 36 is blown out such that the second fuse layer 35 and the first fuse layer 34 remain, the second fuse layer 35 and the first fuse layer 34 are connected in parallel to the fuse read out circuit. At this time, a resistance value R5 is represented by formula (2).

$$R5 = R1 \times R2 / (R1 + R2) \quad (2)$$

Figure 4D:
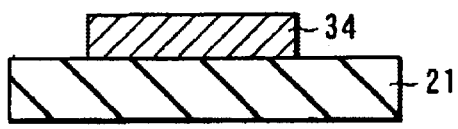
FIG. 4D is a cross-sectional view showing a state of enlarged fuse portion subsequent to laser irradiation in the semiconductor device according to the second embodiment of the present invention.

As shown in FIG. 4D, in a state in which the third fuse layer 36 and the second fuse layer 35 are fuses such that only the first fuse layer 34 remains, only the first fuse layer 34 is connected to the fuse read out circuit. At this time, a resistance value R6 is R1.

Figure 4E:
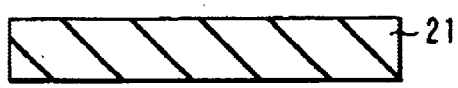
FIG. 4E is a cross-sectional view showing a state of enlarged fuse portion subsequent to laser irradiation in the semiconductor device according to the second embodiment of the present invention.

As shown in FIG. 4E, in a state in which the first fuse layer 34, the second fuse layer 35 and the third fuse layer 36 are blown out and resultantly cut, the resistance is infinity because no fuse is connected to the fuse read out circuit.

Figure 5:
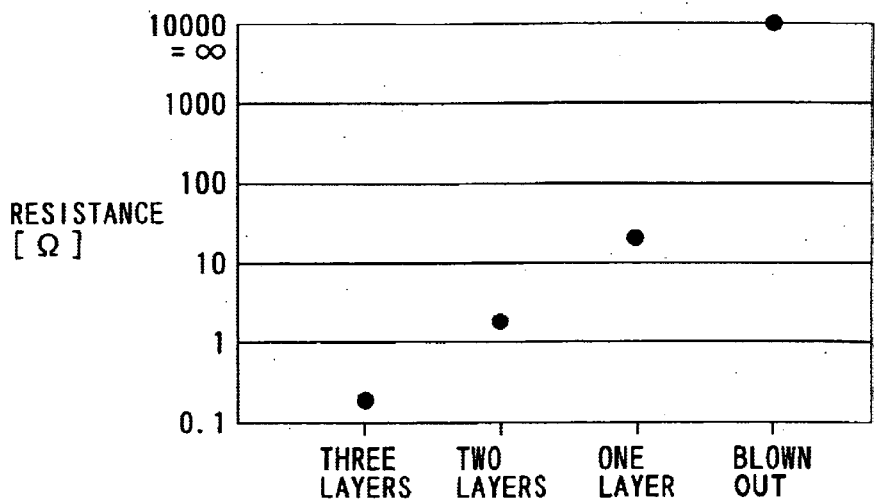
FIG. 5 is a characteristic view showing resistance values depending on the state of fuses in the semiconductor device according to the second embodiment of the present invention.

In a case of using the fuse relating to the second embodiment, as shown in FIG. 5, distribution of the resistance value exhibits a multiple-step shape. Namely, the resistance value varies stepwise corresponding to successive blowing of the third fuse layer 36, the second fuse layer 35 and the first fuse layer 34. The graph is represented with semi-log. It is found from this graph that the resistance value of the fuse can vary by one figure by forming the fuse with a structure in which multiple layers made of materials with different resistances are laminated and by blowing successively the laminated fuse layers.

If the fuse is formed by three layers, i.e., if the first fuse layer 34, the second fuse layer 35 and the third fuse layer 36 remain, the resistance value of the fuse is about 0.2Ω. If the fuse is formed by two layers, i.e., if the third fuse layer 36 is blown out such that the second fuse layer 35 and the first fuse layer 34 remain, the resistance value of the fuse is about 2Ω. In the fuse is formed by one layer, i.e., if the third fuse layer 36 and the second fuse layer 35 are fuses such that only the first fuse layer 34 remains, the resistance value of the fuse is about 20Ω.

As in the first embodiment, the larger the thickness of the fuse 33 is, the smaller its resistance is. The smaller the thickness of the fuse 33 is, the larger its resistance is. By using material layers with resistance value which is gradually larger toward the lower layer, it is significant that the thicker the fuse is, the smaller its resistance value is. Further, the thinner the fuse is, the larger its resistance value is. Compared to the first embodiment, it is possible to easily identify the amount of information depending on the state of fuse.

In the second embodiment, each of the fuses is partially evaporated or blown out by laser irradiation as in the first embodiment. Actually, each of the fuses is set on the semiconductor device so as to have a predetermined thickness as shown in FIG. 3C.

The initial number of layers of fuse is not limited to three as shown in FIGS. 4A and 4B, and two or four or more types of fuses layers may be laminated to form the fuse. The amount of information which can be stored in the fuse is increased by the number of fuse layers.

For example, an AlCu layer may be used as an upper fuse layer with low resistance value, and a polysilicon layer may be used as a lower fuse layer with high resistance value. In a case of fuse with three layers, the AlCu layer is formed as the uppermost layer, a tungsten layer as an intermediate layer and a polysilicon layer as the bottom layer.

In the first embodiment, high controllability of laser irradiation is required to precisely set the thickness of the fuse. In the second embodiment, since the laminated fuse layers have different compositions, even if the controllability of laser irradiation is lowered that in the first embodiment, the fuse with a thickness which provides a suitable resistance value can be formed.

In the second embodiment, a material with the smallest resistance is formed on the top layer of the fuse. Materials with larger resistances are used for lower layers. It is possible to provide a semiconductor device which includes a fuse whose resistance value can be adjusted stepwise by laminating a plurality of fuse layers made of different materials. The resistance value may be continuously adjusted.

The first and second embodiments have been described with a fuse used as an example. A fusible conductive layer may be used in place of the fuse.

In accordance with the first and second embodiments, it is possible to provide a semiconductor device in which an area of fuse corresponding to the amount of information required for defective bits can be made small. Further, in accordance with the first and second embodiments, it is possible to provide a semiconductor device which includes a fuse with small area but large storage capacity formed by increasing the storage capacity of information per unit area.

What is claimed is:

1. A semiconductor device comprising:
   a semiconductor substrate with which a circuit element is provided;
   an insulating layer which is provided on said semiconductor substrate and has a concave portion;
   a first conductive line layer which is provided on a bottom surface of said concave portion in said insulating layer and has a first thickness; and
   a second conductive line layer which is provided on a bottom surface of said concave portion so as to be formed apart in a horizontal direction from said first conductive line layer and has a second thickness which is smaller than the first thickness.

2. The semiconductor device according to claim 1, wherein said first conductive line layer and said second conductive line layer have the same width and length.

3. A semiconductor device according to claim 1, further comprising at least one conductive line layer with a thickness different from another conductive line layer in a range of said first thickness to said second thickness, provided at said concave portion in said insulating layer so as to be formed apart in a horizontal direction from said first conductive line layer and the second conductive line layer.

4. The semiconductor device according to claim 1, wherein said first conductive line layer, said second conductive line layer and said at least one conductive layer have the same width and length.

5. A semiconductor device according to claim 1, further comprising a plurality of conductive line layers with a thickness different from another conductive line layer in a range of said first thickness to said second thickness, provided at said concave portion in said insulating layer so as to be formed apart in a horizontal direction from said first conductive line layer and the second conductive line layer.

6. The semiconductor device according to claim 5, wherein said first conductive line layer, said second conductive line layer and said plurality of conductive line layers have the same width and length.

7. A semiconductor device comprising:
   a semiconductor substrate with which a circuit element is provided;
   an insulating layer which is provided on said semiconductor substrate and has a concave portion; and
   a conductive line layer made of N layers (wherein N is an integer of 2 or larger) which is provided on a bottom surface of said concave portion with each layer having the same width, length and thickness, and its resistance value being successively smaller toward the bottom layer.

8. The semiconductor device according to claim 7, wherein said N layers of the conductive line layer have resistance values being successively smaller toward the bottom layer.

9. The semiconductor device according to claim 8, wherein said N layers of the conductive line layer comprises two superposed conductive line layers, a lower conductive line layer is made of a polysilicon layer and an upper conductive line layer is AlCu layer.

10. The semiconductor device according to claim 7, further comprising a conductive line layer made of M layers (wherein M is an integer of 2 or larger and is different from N) which is provided at said concave portion in said insulating film so as to be spaced apart from said conductive line layer made of N layers, with each layer having the same width, length and thickness, and its resistance value being successively smaller toward the bottom layer.

11. The semiconductor device according to claim 10, wherein said N layers of conductive line layer have resistance values being successively smaller toward the bottom layer.

12. The semiconductor device according to claim 11, wherein said N layers of the conductive line layer comprises three superposed conductive line layers, a lower conductive line layer is made of a polysilicon layer, an intermediate conductive line layer is made of tungsten layer and an upper conductive line layer is AlCu layer.

13. A semiconductor device comprising:
   a semiconductor substrate with which a circuit element is provided;
   an insulating layer which! is provided on said semiconductor substrate and has a concave portion;
   a first fuse which is provided at said concave portion in said insulating layer and is formed by laminating K fuse layers with different resistance values (wherein K is an integer of 2 or larger); and
   a second fuse which is provided at said concave portion in said insulating layer so as to be spaced apart from said first fuse, with its end portion having the same laminated structure as that of said first fuse, and its layers from the top layer of said first fuse to the Lth fuse layer (wherein L is an integer of 1 or larger and less than K) being removed at its portion other than said end portion.

14. The semiconductor device according to claim 13, wherein said N layers of the conductive line layer have resistance values being successively smaller toward the bottom layer.

15. The semiconductor device according to claim 14, wherein said N layers of the conductive line layer comprises two superposed conductive line layers, a lower conductive line layer is made of a polysilicon layer and an upper conductive line layer is AlCu layer.

16. The semiconductor device according to claim 14, wherein said N layers of the conductive line layer comprises three superposed conductive line layers, a lower conductive line layer is made of a polysilicon layer, an intermediate conductive line layer is made of tungsten layer and an upper conductive line layer is AlCu layer.

* * * * *